(12) United States Patent
Kawabe et al.

(10) Patent No.: US 8,823,682 B2
(45) Date of Patent: Sep. 2, 2014

(54) PROXIMITY SENSOR AND ELECTRONIC DEVICE

(75) Inventors: Isamu Kawabe, Osaka (JP); Takahiro Inoue, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 265 days.

(21) Appl. No.: 13/298,950

(22) Filed: Nov. 17, 2011

(65) Prior Publication Data

US 2012/0139877 A1 Jun. 7, 2012

(30) Foreign Application Priority Data

Dec. 2, 2010 (JP) ................................ 2010-269362

(51) Int. Cl.
*G06F 3/042* (2006.01)
(52) U.S. Cl.
USPC ......................................................... 345/175
(58) Field of Classification Search
USPC ................................................. 345/173–176
See application file for complete search history.

(56) References Cited

U.S. PATENT DOCUMENTS

| | | | |
|---|---|---|---|
| 8,217,335 B2 | 7/2012 | Hiramatsu et al. | |
| 2005/0119050 A1* | 6/2005 | Suzuki | 463/36 |
| 2011/0006188 A1* | 1/2011 | Lin | 250/201.1 |
| 2011/0120784 A1* | 5/2011 | Osoinach et al. | 178/18.06 |

FOREIGN PATENT DOCUMENTS

| | | |
|---|---|---|
| JP | 2006-19939 A | 1/2006 |
| JP | 2009-152813 A | 7/2009 |
| JP | 2010-50943 A | 3/2010 |
| JP | 2010-71811 A | 4/2010 |
| JP | 2010-199706 A | 9/2010 |

\* cited by examiner

*Primary Examiner* — Robin Mishler
(74) *Attorney, Agent, or Firm* — Birch, Stewart, Kolasch & Birch, LLP (57) ABSTRACT

A proximity sensor (1) includes a state updating section (22) and a control section (5). The state updating section (22) updates state information. In a case where the state information is updated with a state (ST1) or a state (ST4), the control section (5) supplies, to the outside of the proximity sensor (1), a signal (S6) indicating that at an object (B) to be detected does not come close to the proximity sensor (1). In a case where the state information is updated with a state (ST2) or a state (ST3), the control section (5) supplies, to the outside of the proximity sensor (1), a signal (S6) indicating that the object (B) to be detected comes close to the proximity sensor (1).

7 Claims, 6 Drawing Sheets

|  | REGISTER | LOWER BIT | DETECTED RESULT |
|---|---|---|---|
| STATE ST1 | 00 | 0 | NON-PROXIMITY STATE |
| STATE ST2 | 01 | 1 | PROXIMITY STATE |
| STATE ST3 | 11 | 1 | PROXIMITY STATE |
| STATE ST4 | 10 | 0 | NON-PROXIMITY STATE |

PROXIMITY SENSOR AND ELECTRONIC DEVICE

TECHNICAL FIELD

The present invention relates to a proximity sensor to be mounted in an electronic device such as a mobile phone.

BACKGROUND ART

In recent years, mobile devices (electronic devices, more specifically, portable electronic devices), which include a screen (e.g. a liquid crystal screen) having a touch panel, have been widely used. Mobile phones and smart phones are typical examples of such mobile devices. The mobile devices are in the process of increasingly becoming more multi-functioned, more compact, or thinner. Some of the mobile devices, recently put on the market, are equipped with a proximity sensor. The proximity sensor detects (senses) whether or not there is an object which comes close to a mobile device in which the proximity sensor is included.

The proximity sensor is applied, for example, to the following case. Specifically, a user holds his phone, which includes a screen having a touch panel, to his ear when the user answers a call. The phone may erroneously operates if the screen is accidentally brought into contact with his skin while he is holding the phone to his ear in a situation where (i) a screen display is ON and (ii) a touch panel function is activated.

To prevent such an erroneous operation, the following control is carried out. In a case where the proximity sensor detects the user's skin that comes close to the phone while the phone is being held to his ear in a situation where (i) the screen display is ON and (ii) the touch panel function is activated, a control section of the phone carries out the following control in accordance with a result detected by the proximity sensor.

The control section controls the display screen to be turned off and the touch panel function to be changed from an active state to a non-active state. And, when the phone is taken away from the user's skin after he finishes talking on the phone, the proximity sensor detects a change from (i) a proximity state in which the skin comes close to the phone to (ii) a non-proximity state in which the skin does not come close to the phone. In response to the change thus detected by the proximity sensor, the control section controls the screen display to be turned on again and the touch panel function to be activated again.

Next, the following description will discuss a case where a proximity sensor is used in a media player, which is a mobile device. Before getting into the main topic, we will briefly describe a media player in which no proximity sensor is mounted. Normally, a user presses a button in order to turn off a power source of a panel in the media player, in which no proximity sensor is mounted. The panel is turned off when, for example, the media player is in a pocket of the user.

Now, the following description will discuss a media player in which a proximity sensor is mounted. In a case where (i) the media player is put into a user's pocket in a situation where (a) a screen display is ON and (b) a touch panel function is activated and (ii) the proximity sensor detects a state where the media player and a material of clothes that the user is wearing (or a material of the user's pocket) are in proximity with each other in the user's pocket, the screen display of the media player is controlled to be turned off and the touch panel function of the media player is changed to a non-active state.

In contrast, in a case where the media player is taken out the user's pocket and the proximity sensor detects a state where the media player and the material of the clothes (or the material of the user's pocket) are not in proximity to each other, the screen display of the media player is controlled to be turned on again and the touch panel function of the media player is controlled to be changed to an active state again.

Since the screen display and the touch panel function are thus controlled, it becomes possible to prevent a mobile device from erroneously operating in a case where a touch panel function is in an active state during a time period not intended by the user. In addition, since the screen display is controlled to be turned off, it becomes also possible to reduce power consumption.

It is anticipated that a proximity sensor will be generally employed in various electronic devices such as mobile phones and media players. Note that conditions (i.e., conditions for mounting the proximity sensor) such as (i) where in an electronic device the proximity sensor is to be mounted and (ii) a shape of an outer surface of a housing of the electronic device in which the proximity sensor is mounted vary among makers and product models. This is mainly because the conditions are bound by a physical appearance of and a design of an electronic device in which the proximity sensor is to be mounted. Such being the case, there is a big demand for a proximity sensor (object sensing device) whose property is equal among various mounting conditions. Note that indices of the property encompass a detection distance (a distance, between an object to be detected and the proximity sensor, which causes the proximity sensor to determine that the object to be detected comes close to the electronic device) and a rate of occurrence of erroneous operations.

Patent Literature 1 and 2 disclose conventional proximity sensors. Patent Literature 1 discloses a proximity sensor which has an illuminance sensing function and can reduce power consumption without deteriorating accuracy in detecting a proximity state of an object to be detected. Patent Literature 2 discloses a mobile phone 1 that includes a human sensor 10 for determining whether or not a person comes close to the mobile phone 1, on the basis of a signal supplied from an infrared sensor and a signal supplied from a proximity sensor.

Figure 6:
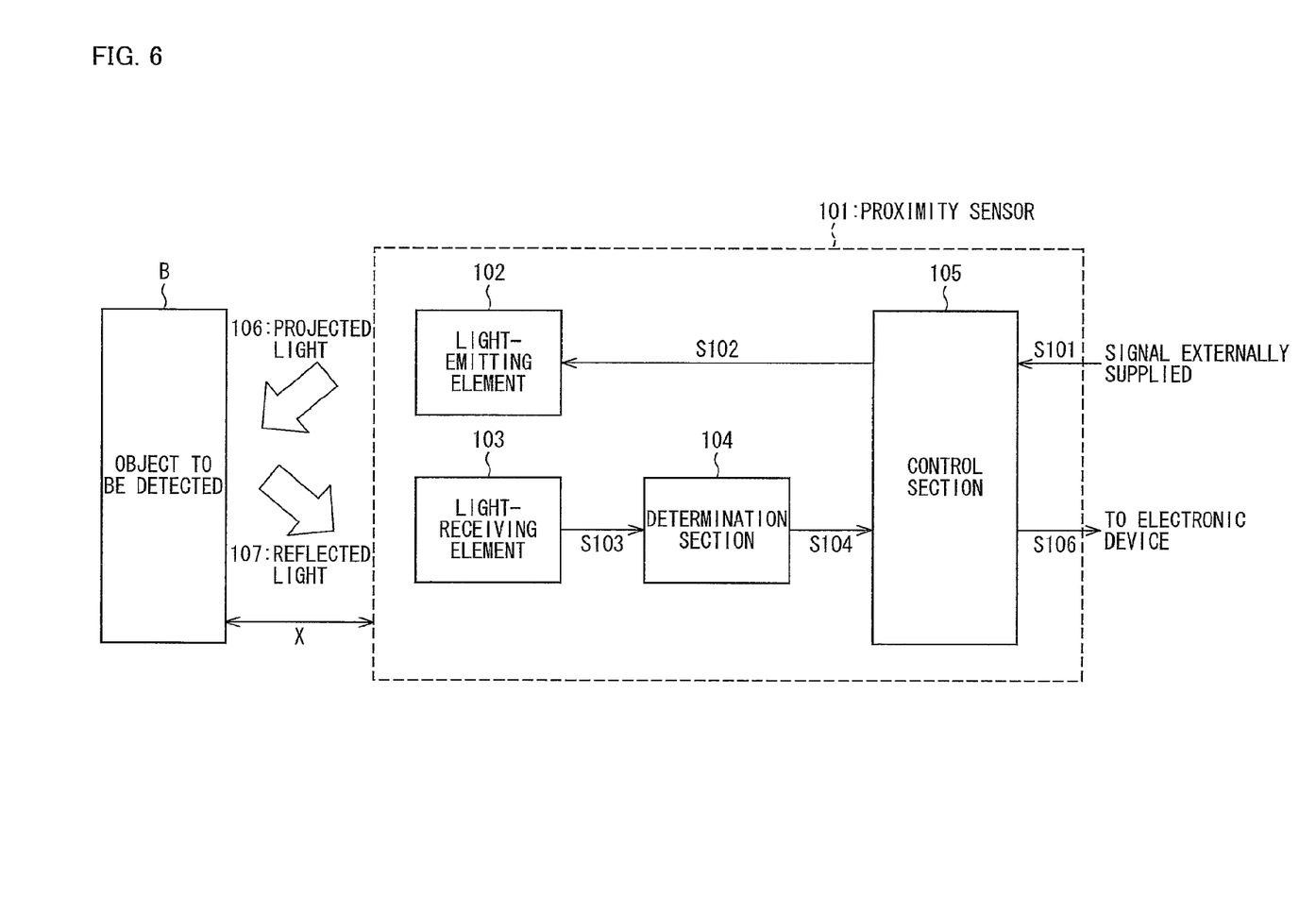
FIG. 6 is a block diagram illustrating a conventional proximity sensor that is configured by main parts of a proximity sensor, disclosed in Patent Literature 1, which has an illuminance sensing function.

FIG. 6 is a block diagram illustrating a conventional proximity sensor 101, which is configured by main parts of the proximity sensor, disclosed in Patent Literature 1, which has the illuminance sensing function.

The proximity sensor 101 illustrated in FIG. 6 is mounted in an electronic device. The proximity sensor 101 includes a light-emitting element 102, a light-receiving element 103, a determination section 104, and a control section 105. The light-emitting element 102 projects (emits), toward a predetermined space, light 106. The light-receiving element 103 receives reflected light 107, which is light obtained when the light 106 is reflected from an object B to be detected to which object B a detection of whether or not the object B to be detected comes close to the proximity sensor 101 is carried out. The light-receiving element 103 supplies an electric current signal S103 in accordance with a quantity of the reflected light 107. The determination section 104 includes a first electric current source that supplies a predetermined first threshold electric current and a second electric current source that supplies a predetermined second threshold electric current. The determination section 104 determines whether the electric current signal S103 is not more than the second threshold electric current or more than the first threshold electric current. The determination section 104 supplies a determination result signal S104 indicative of a result of determination made by the determination section 104. The control section 105 supplies, to the light-emitting element 102, a light emission instruction signal S102 for instructing the light-emitting element 102 to project the light 106. In a case where the electric current signal S103 is not more than the second threshold electric current, the control section 105 determines that the proximity sensor 101 is in a non-proximity state, in which the object B to be detected does not come close to the proximity sensor 101. In a case where the electric current signal S103 is more than the first threshold electric current, the control section 105 determines that the proximity sensor 101 is in a proximity state, in which the object B to be detected comes close to the proximity sensor 101. Then, the control section 105 supplies, to the electronic device, a signal S106 indicative of the non-proximity state (or the proximity state) and for controlling the electronic device. Note that a signal S101 can be externally supplied to the control section 105 if necessary.

The light-emitting element 102 and the light-receiving element 103, each molded with molding resin, are provided in a single package. In some of the proximity sensors currently on the market, the light-emitting element 102 and the light-receiving element 103 are separately provided instead of being provided in a single package.

The following description will discuss a principle of operation of the proximity sensor 101 illustrated in FIG. 6. According to the proximity sensor 101, the light 106, projected from the light-emitting element 102 toward the predetermined space, is reflected from the object B to be detected and then enters, as the reflected light 107, the light-receiving element 103.

The determination section 104 includes the first and second electric current sources that supply the predetermined first and second threshold electric currents, respectively. The determination section 104 makes a comparison between the electric current signal S103 and the respective predetermined first and second threshold electric currents so as to determine (judge) whether the electric current signal S103 is more than the predetermined first threshold electric current or not more than the predetermined second threshold electric current. A result of the determination is supplied, as the determination result signal S104, to the control section 105. Thus, a state, indicating whether or not the object B to be detected comes close to the proximity sensor 101, is determined. The following description will discuss this in detail.

In a case where the object B to be detected does not come close to the proximity sensor 101, the light 106, which is projected from the light-emitting element 102 in response to the light emission instruction signal S102 supplied from the control section 105, is diffused. As a result, little of the reflected light 107 enters the light-receiving element 103.

This causes the determination section 104 of the proximity sensor 101 to determine that the electric current signal S103 is not more than the predetermined second threshold current. The determination section 104 supplies, to the control section 105, the determination result signal S104 indicating that the electric current signal S103 is not more than the predetermined second threshold electric current. This causes the proximity sensor 101 to be changed to the non-proximity state (the state in which the object B to be detected does not come close to the proximity sensor 101).

In contrast, in a case where the object B to be detected comes close to the proximity sensor 101, the light 106, which is projected from the light-emitting element 102 in response to the light emission instruction signal S102 supplied from the control section 105, is reflected from the object B to be detected and then enters, as the reflected light 107, the light-receiving element 103.

The determination section 104 of the proximity sensor 101 determines that the electric current signal S103 is more than the predetermined first threshold current. The determination section 104 supplies, to the control section 105, the determination result signal S104 indicating that the electric current signal S103 is more than the predetermined first threshold electric current. This causes the proximity sensor 101 to be changed to the proximity state (the state in which the object B to be detected comes close to the proximity sensor 101).

CITATION LIST

Patent Literature

Patent Literature 1
Japanese Patent Application Publication, Tokukai, No. 2010-199706 A (Publication Date: Sep. 9, 2010)
Patent Literature 2
Japanese Patent Application Publication, Tokukai, No. 2010-50943 A (Publication Date: Mar. 4, 2010)

SUMMARY OF INVENTION

Technical Problem

In examples in which a proximity sensor, mounted in a mobile device such as a smart phone, is used, it is necessary that (i) the proximity sensor quickly detect a state in which the object to be detected comes close to the proximity sensor and (ii) the screen display of the mobile device, for example, be quickly controlled to turn off, in a case where the object to be detected comes close to the proximity sensor.

In a case where the object to be detected gets away from the proximity sensor, it is necessary that (i) the proximity sensor quickly detect (recognize) a change to a state in which the object to be detected does not come close to the proximity sensor and (ii) the screen display of the mobile device, for example, be quickly controlled to turn on.

It is thus expected that the proximity sensor mounted in the mobile device such as a smart phone be further improved in response.

Normally, a threshold is set which causes the proximity sensor to determine whether or not an object to be detected comes close to the proximity sensor. In the proximity sensor 101 illustrated in FIG. 6, the threshold is an electric current (threshold electric current).

In a case of a single threshold, a distance between the object to be detected and the proximity sensor increases or decreases (fluctuates) due to a camera shake or the like. This causes the proximity sensor to alternate between (i) the proximity state, in which the object to be detected comes close to the proximity sensor and (ii) the non-proximity state, in which the object to be detected does not come close to the proximity sensor. The alternating between the proximity state and the non-proximity state will be referred to as 'chattering' throughout the present Description.

In Patent Literature 2, in which a single threshold is set, the chattering is prevented by setting a large time constant of the proximity sensor. Note, however, that it is impossible to prevent chattering whose cycle is longer than a set time constant.

As such, two thresholds, a first threshold and a second threshold, are set in a general proximity sensor so as to prevent the chattering. In the proximity sensor 101 illustrated in FIG. 6, for example, the determination section 104 includes the first electric current source and the second electric current source. The first threshold electric current, which is supplied from the first electric current source and corresponds to the first threshold, is more than the second threshold electric current, which is supplied from the second electric current source and corresponds to the second threshold.

If the electric current signal S103, which is supplied in accordance with the quantity of the reflected light 107, becomes more than the first threshold electric current, which is a threshold corresponding to a case where a distance X (a distance between the object B to be detected and the proximity sensor 101) is D [mm], then the proximity sensor 101 is changed to the proximity state, in which the object B to be detected comes close to the proximity sensor 101.

In contrast, if the electric current signal S103, which is supplied in accordance with the quantity of the reflected light 107, becomes not more than the second threshold electric current, which is a threshold corresponding to a case where the distance X is E [mm], then the proximity sensor 101 is changed to the non-proximity state, in which the object B to be detected does not come close to the proximity sensor 101.

Figure 7:
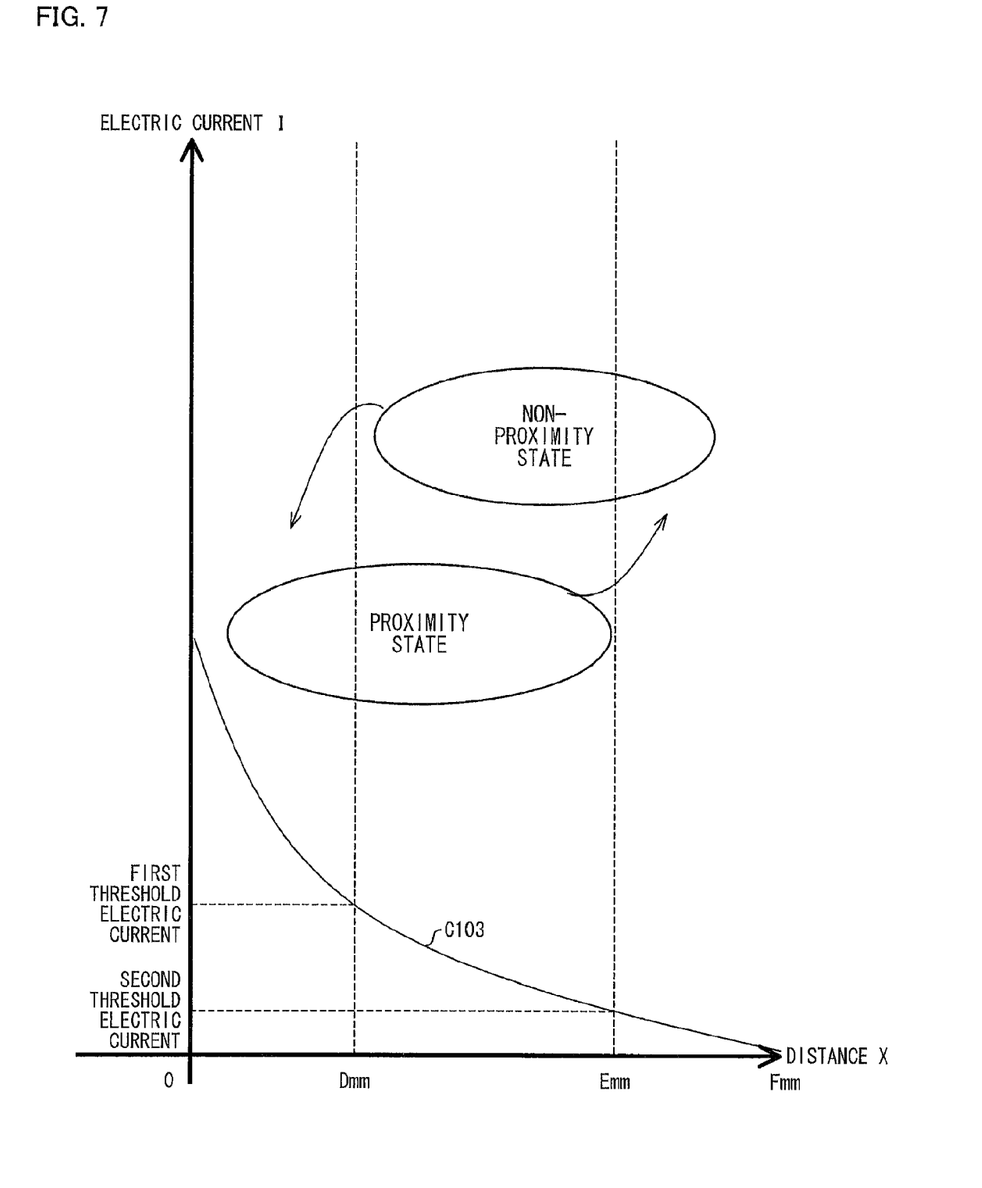
FIG. 7 is a graph showing how a proximity state and a non-proximity state are determined in the proximity sensor 101 of FIG. 6.

FIG. 7 is a graph showing how the proximity state and the non-proximity state are determined in the proximity sensor 101 illustrated in FIG. 6. In the graph of FIG. 7, the horizontal axis indicates the distance X between the object B to be detected and the proximity sensor 101, and the vertical axis indicates an electric current I. An area where the distance X takes a negative value indicates the object B to be detected. The curve C103 in the first quadrant of the graph indicates the electric current signal S103.

In a case where the object B to be detected approaches the proximity sensor 101, the distance X in the graph of FIG. 7 changes from F (F>>E)→E→D→0. When the distance X becomes smaller than D, the electric current signal S103 becomes more than the first threshold electric current. This causes the proximity sensor 101 to be changed to the proximity state.

In contrast, in a case where the object B to be detected moves away from the proximity sensor 101, the distance X changes from 0→D→E→F. When the distance X becomes E or greater, the electric current signal S103 becomes not more than the second threshold electric current. This causes the proximity sensor 101 to be changed to the non-proximity state.

It is possible to prevent the chattering, caused by a camera shake or the like, by making a determination (see FIG. 7) in the proximity sensor 101 of FIG. 6.

However, according to the determination shown in the graph of FIG. 7, the proximity sensor 101 is not changed to the proximity state unless the electric current signal S103 becomes more than the first threshold electric current, even though the two threshold currents are set. That is, the proximity sensor 101 is changed to the proximity state only after the electric current signal S103 becomes more than the first threshold electric current.

The same applies to the second threshold electric current. The proximity sensor 101 is not changed to the non-proximity state unless the electric current signal S103 becomes not more than the second threshold electric current. That is, the proximity sensor 101 is changed to the non-proximity state only after the electric current signal S103 becomes not more than the second threshold electric current.

This inhibits the conventional proximity sensor 101, which is illustrated in FIG. 6 and makes the determination shown in FIG. 7, from attaining 'improvement in response.' That is, the proximity sensor 101 cannot quickly be changed from the proximity state to the non-proximity state, or vice versa.

The present invention is accomplished in view of the problem. An object of the present invention is to provide a proximity sensor and an electronic device which are improved in response as compared with a conventional proximity sensor.

Solution to Problem

In order to attain the object, a proximity sensor in accordance with the present invention is a proximity sensor for detecting whether or not an object to be detected comes close to the proximity sensor, comprising: a light-emitting element for projecting light toward a predetermined space; a light-receiving element for (i) receiving reflected light, which is light obtained when the light projected by the light-emitting element is reflected from the object to be detected and (ii) outputting an electric current signal in accordance with a quantity of the reflected light; storage means for storing state information indicative of a state of the electric current signal; determination means for determining large or small between the electric current signal and respective first and second thresholds, the second threshold being less than the first threshold; state updating means for (i) updating the state information with first information indicating that the electric current signal is not more than the second threshold, when it is determined by the determination means that the electric current signal is not more than the second threshold, (ii) updating the state information with second information indicating that the electric current signal is more than the second threshold, when (a) it is determined by the determination means that the electric current signal is more than the second threshold and (b) the state information is the first information, (iii) updating the state information with third information indicating that the electric current signal is not less than the first threshold, when it is determined by the determination means that the electric current signal is not less than the first threshold, and (iv) updating the state information with fourth information indicating that the electric current signal is less than the first threshold, when (a) it is determined by the determination means that the electric current signal is less than the first threshold and (b) the state information is the third information; and controlling means for (i) supplying, to an outside of the proximity sensor, a signal indicating that the object to be detected does not come close to the proximity sensor, in a case where the state information is updated with the first information or the fourth information and (ii) supplying, to the outside of the proximity sensor, a signal for indicating that the object to be detected comes close to the proximity sensor, in a case where the state information is updated with the second information or the third information.

As described above, in the present invention, the controlling means (i) supplies, to an electronic device, a signal indicating that the object to be detected does not come close to the proximity sensor, in a case where the state information is updated with the first information or the fourth information and (ii) supplies, to the outside of the proximity sensor, a signal for indicating that the object to be detected comes close to the proximity sensor, in a case where the state information is updated with the second information or the third information.

According to determination means of a conventional proximity sensor, (i) a transition of an object to be detected occurs only just once from a proximity state to a non-proximity state and (ii) even if an electric current signal becomes less than a first threshold, a transition of the object to be detected does not occur unless the electric current signal becomes not more than a second threshold.

In contrast, according to the proximity sensor of the present invention, first and second transitions of the object to be detected occur from the proximity state to the non-proximity state (i.e., twice, one of which is at a time of updating to the first information and the other of which is at a time of updating to the fourth information). As such, the first and second transitions occur immediately when the electric current signal becomes less than the first threshold electric current or when the electric current signal becomes not more than the second threshold electric current, respectively. This allows an improvement in response of the proximity sensor of the present invention, as compared with the conventional proximity sensor.

Likewise, according to the determination means of the conventional proximity sensor, (i) a transition of the object to be detected occurs just once from the non-proximity state to the proximity state and (ii) even if the electric current signal becomes more than the second threshold, a transition of the object to be detect does not occur unless the electric current signal becomes not less than the first threshold.

In contrast, in the proximity sensor of the present invention, first and second transitions of the object to be detected occur from the non-proximity state to the proximity state (i.e., twice, one of which is at a time of updating to the second information and the other of which is at a time of updating to the third information). As such, the first and second transitions occur immediately when the electric current signal becomes more than the second threshold or when the electric current signal becomes not less than the first threshold. This allows an improvement in response of the proximity sensor of the present invention, as compared with the conventional proximity sensor.

Thus, the proximity sensor of the present invention has more transitions, as compared with the conventional proximity sensor, from the proximity state to the non-proximity state and vice versa. The proximity sensor of the present invention requires less time for such transitions than that required by the conventional proximity sensor. Therefore, the proximity sensor of the present invention is improved in response as compared with the conventional proximity sensor.

The electronic device of the present invention includes the proximity sensor of the present invention, and therefore is improved in response as compared with an electronic device including the proximity sensor.

Advantageous Effects of Invention

As described above, a proximity sensor of the present invention includes: a light-emitting element for projecting light toward a predetermined space; a light-receiving element for (i) receiving reflected light, which is light obtained when the light projected by the light-emitting element is reflected from the object to be detected and (ii) outputting an electric current signal in accordance with a quantity of the reflected light; storage means for storing state information indicative of a state of the electric current signal; determination means for determining large or small between the electric current signal and respective first and second thresholds, the second threshold being less than the first threshold; state updating means for (i) updating the state information with first information indicating that the electric current signal is not more than the second threshold, when it is determined by the determination means that the electric current signal is not more than the second threshold, (ii) updating the state information with second information indicating that the electric current signal is more than the second threshold, when (a) it is determined by the determination means that the electric current signal is more than the second threshold and (b) the state information is the first information, (iii) updating the state information with third information indicating that the electric current signal is not less than the first threshold, when it is determined by the determination means that the electric current signal is not less than the first threshold, and (iv) updating the state information with fourth information indicating that the electric current signal is less than the first threshold, when (a) it is determined by the determination means that the electric current signal is less than the first threshold and (b) the state information is the third information; and controlling means for (i) supplying, to an outside of the proximity sensor, a signal indicating that the object to be detected does not come close to the proximity sensor, in a case where the state information is updated with the first information or the fourth information and (ii) supplying, to the outside of the proximity sensor, a signal for indicating that the object to be detected comes close to the proximity sensor, in a case where the state information is updated with the second information or the third information.

With these configurations, it becomes possible to provide a proximity sensor and an electronic device which are improved in response as compared with a conventional proximity sensor.

DESCRIPTION OF EMBODIMENTS

An embodiment of the present invention will be described below with reference to FIGS. 1 through 5.

[Proximity Sensor 1]

Figure 1:
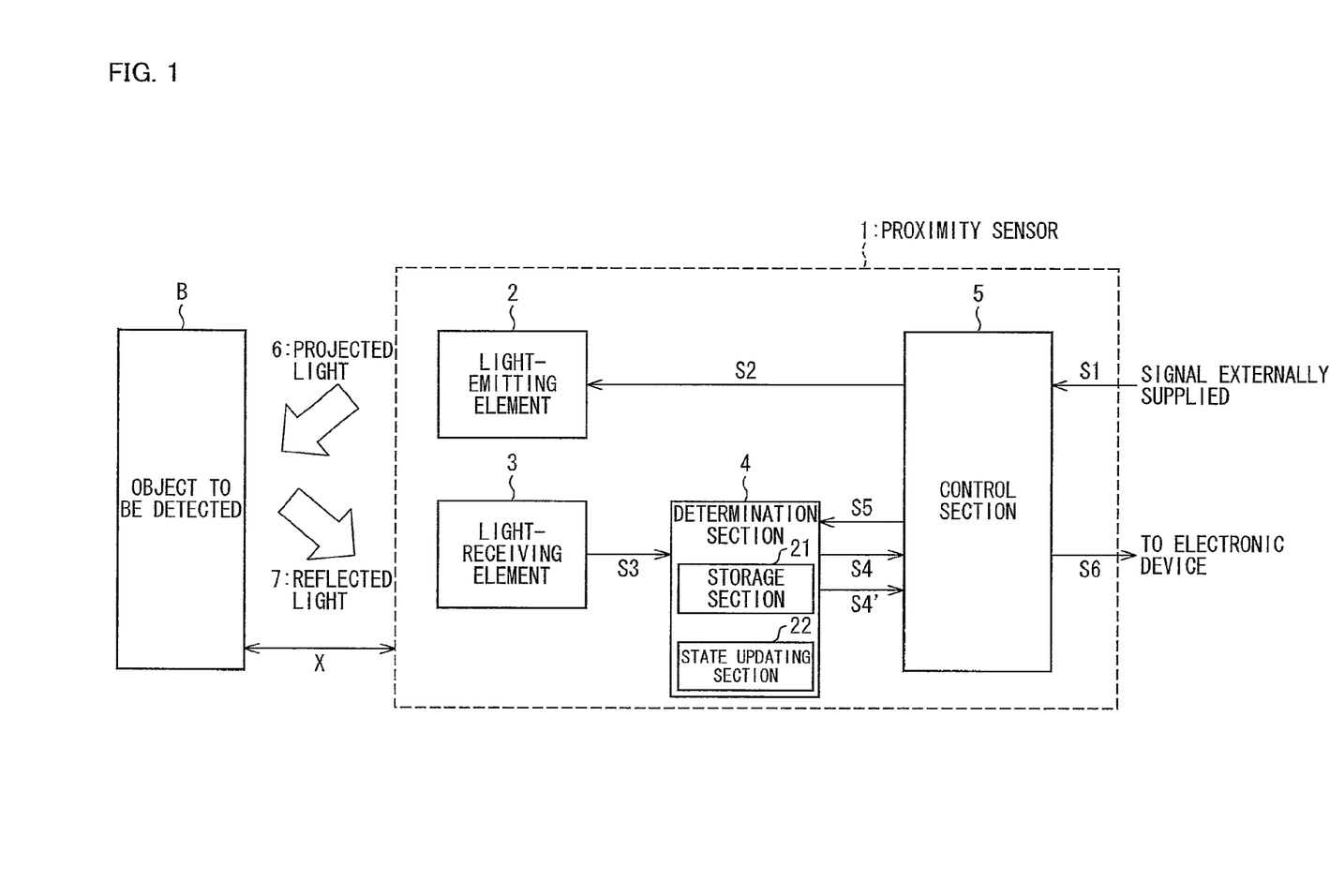
FIG. 1 is a block diagram illustrating a proximity sensor in accordance with an embodiment of the present invention.

FIG. 1 is a block diagram illustrating a proximity sensor 1 in accordance with the present embodiment.

The proximity sensor 1 illustrated in FIG. 1 detects whether or not an object B to be detected comes close to the proximity sensor 1. The proximity sensor 1 includes: a light-emitting element 2 for projecting (emitting) light 6 toward a predetermined space; a light-receiving element 3 for (i) receiving reflected light 7, which is light obtained when the light 6 is reflected from the object B to be detected and (ii) outputting an electric current signal S3 in accordance with a quantity of the reflected light 7; a storage section 21 (storage means) for storing state information indicative of a state of the electric current signal S3; a determination section 4 (determination means) for determining large or small between the electric current signal S3 and respective first and second threshold electric currents (first and second thresholds), the second threshold electric current being less than the first threshold electric current; a state updating section 22 (state updating means) for (i) updating the state information with a state ST1 (first information) indicating that the electric current signal S3 is not more than the second threshold electric current, when it is determined by the determination section 22 that the electric current signal S3 is not more than the second threshold electric current, (ii) updating the state information with a state ST2 (second information) indicating that the electric current signal S3 is more than the second threshold electric current, when (a) it is determined by the determination section 22 that the electric current signal S3 is more than the second threshold electric current and (b) the state information is the state ST1, (iii) updating the state information with a state ST3 (third information) indicating that the electric current signal S3 is not less than the first threshold electric current, when it is determined by the determination section 22 that the electric current signal S3 is not less than the first threshold electric current, and (iv) updating the state information with a state ST4 (fourth information) indicating that the electric current signal S3 is less than the first threshold electric current, when (a) it is determined by the determination section 22 that the electric current signal S3 is less than the first threshold electric current and (b) the state information is the state ST3; and a control section 5 (controlling means) for (i) supplying, to an outside of the proximity sensor 1 (to an electronic device, for example), a signal S6 indicating that the object B to be detected does not come close to the proximity sensor 1, in a case where the state information is updated with the state ST1 or the state ST4 and (ii) supplying, to the outside of the proximity sensor 1, a signal S6 for indicating that the object B to be detected comes close to the proximity sensor 1, in a case where the state information is updated with the state ST2 or the state ST3.

Note that the storage section and the state updating section are included, for example, in the determination section 4 but can alternatively be provided separately from the determination section 4.

It is only necessary that the electronic device, in which the proximity sensor 1 is mounted, check whether the proximity sensor 1 is in (i) a proximity state, in which an object B to be detected comes close to the proximity sensor 1 or (ii) a non-proximity state, in which the object B to be detected does not come close to the proximity sensor 1, only in a case where (a) the signal S6 indicates that a transition occurs from the non-proximity state to the proximity state or (b) the signal S6 indicates that a transition occurs from the proximity state to the non-proximity state. This will be later described in [Determination Made by Determination Section 4].

Note that a signal S1 (later described) is externally supplied to the control section 5.

The light-emitting element 2 and the light-receiving element 3 can, for example, be each molded with molding resin and be provided in a single package. Alternatively, the light-emitting element 2 and the light-receiving element 3 can be separately provided.

The following description will discuss a principle of an operation of the proximity sensor 1 of FIG. 1. According to the proximity sensor 1, the light 6 is projected from the light-emitting element 2 to the predetermined space, in response to a light emission instruction signal S2 supplied from the control section 5. The light 6 thus projected is reflected from the object B to be detected and then enters, as the reflected light 7, the light-receiving element 3.

The determination section 4 can include, for example, a first electric current source for supplying the first threshold electric current and a second electric current source for supplying the second threshold electric current. The first threshold electric current is more than the second threshold electric current.

The determination section 4 includes a 2-bit register, a lower bit of two bits in the register is used as a determination result signal S4. This will be later described in detail. Note that the lower bit of 0 indicates the non-proximity state and the lower bit of 1 indicates the proximity state. The determination result signal S4 is supplied to the control section 5.

[Determination Made by Determination Section 4]

Figure 2:
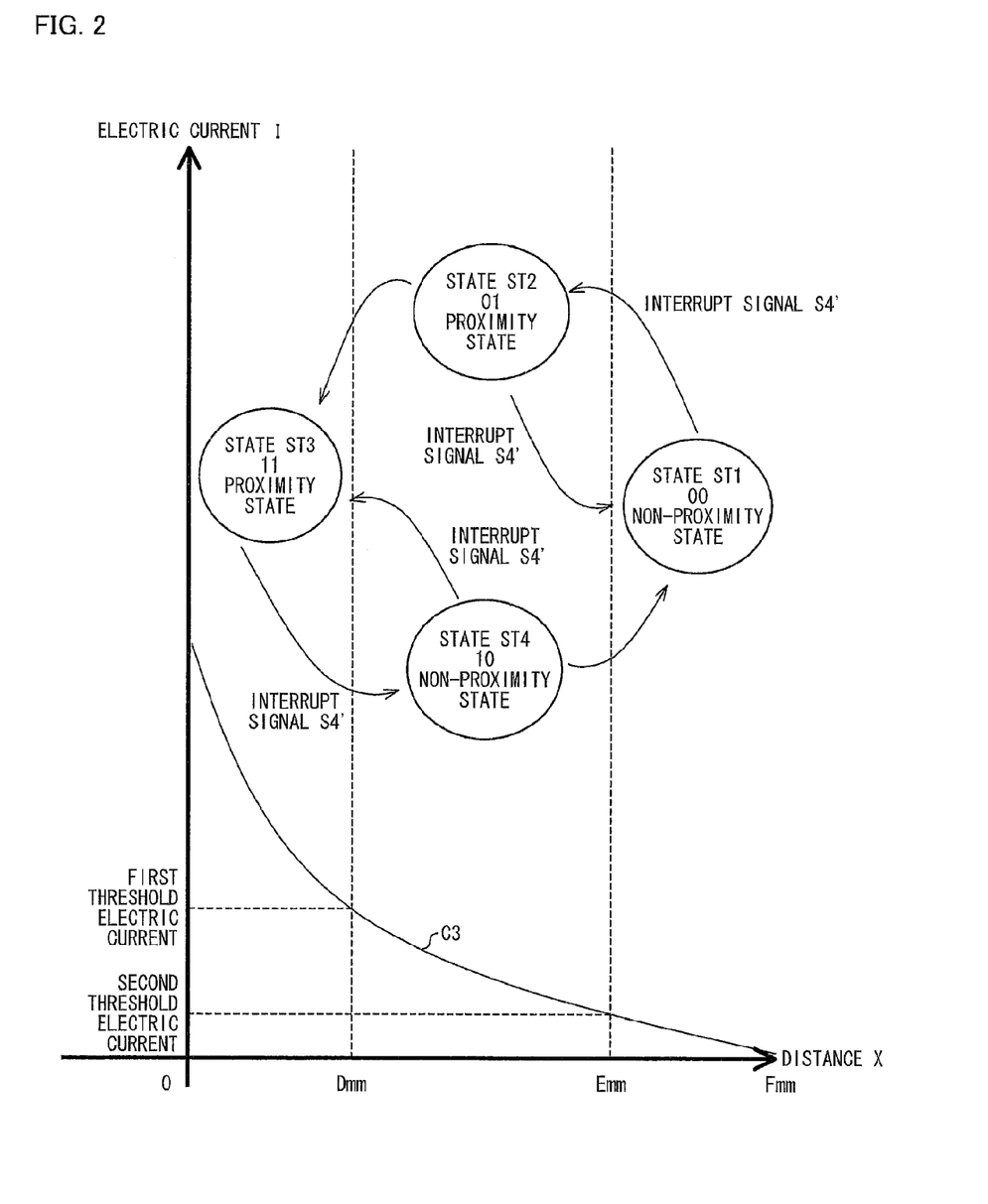
FIG. 2 is a graph showing how a proximity state and a non-proximity state are determined in the proximity sensor of FIG. 1.

FIG. 2 is a graph showing how a determination of a proximity state or a non-proximity state is made in the proximity sensor 1 of FIG. 1. The following description will discuss, with reference to FIG. 2, how the determination section 4 in accordance with the present embodiment makes the determination.

In the graph of FIG. 2, the horizontal axis indicates a distance X between the object B to be detected and the proximity sensor 1, and the vertical axis indicates an electric current I. An area where the distance X takes a negative value indicates the object B to be detected. The curve C3 in the first quadrant of the graph indicates the electric current signal S3. The electric current I increases as the object B to be detected approaches the proximity sensor 1 (i.e., as the distance X becomes smaller). The four circles shown in the first quadrant of the graph indicates respective four states (states ST1 through ST4), each of which indicates the proximity state or the non-proximity state. The first threshold electric current and the second threshold electric current are as early described.

Described first is a case where the object B to be detected approaches the proximity sensor 1 from away (i.e., from a long distance X). That is, the object B to be detected is initially away from the proximity sensor 1 by a sufficiently long distance (i.e., the distance X is not shorter than E [mm]). Note that distances F, E, and D on the horizontal axis in FIG. 2 meet the inequality F$\gg$E$>$D.

In this case, the electric current signal S3, which is supplied to the determination section 4 in response to the reflected light 7 entering the light-receiving element 3, is less than the second threshold electric current. This state is defined as a state ST1. In a case where the determination section 4 makes a first determination in which the electric current signal S3 is less than the second threshold electric current, a value 2'b00, which means "00" expressed by two bits in binary numeral, is stored in the 2-bit register included in the determination section 4 (that is, the value 2'b00 is allocated to the state ST1).

Since the lower bit of the register is "0," the proximity sensor 1 is in the non-proximity state. The lower bit of "0" is supplied, as the determination result signal S4, to the control section 5. The control section 5 supplies, to the electronic device in which the proximity sensor 1 is mounted, the determination result signal S4 as a signal S6 for (i) indicating that the proximity sensor 1 is in the non-proximity state and (ii) controlling an operation of the electronic device.

Next, in a case where the object B to be detected approaches to the proximity sensor 1, so that a transition occurs from the state ST1 in which the electric current signal S3 is less than the second threshold electric current to a state in which the electric current signal S3 increases to be in a range of not less than the second threshold electric current but less than the first threshold electric current, such a state is defined as a state ST2. In a case where the determination section 4 makes a second determination in which the electric current signal S3 has increased from an electric current of less than the second threshold electric current to an electric current in the range of not less than the second threshold electric current but less than the first threshold electric current (that is, in a case where a transition has occurred from the state ST1 to the state ST2), 2'b01 is stored in the register of the determination section 4 (that is, 2'b01 is allocated to the state ST2).

Since the lower bit of the register changes from "0" to "1," the proximity sensor 1 changes from the non-proximity state to the proximity state. The lower bit which has changed from "0" to "1" is supplied, as an interrupt signal S4', to the control section 5. The control section 5 supplies, to the electronic device in which the proximity sensor 1 is mounted, the interrupt signal S4' as a signal S6 for (i) indicating that the proximity sensor 1 has been changed from the non-proximity state to the proximity state and (ii) controlling the operation of the electronic device.

The determination result signal S4 and the interrupt signal S4' are thus supplied from the same signal route. Note, however, that the present embodiment is not limited to this, and the determination result signal S4 and the interrupt signal S4' can therefore be supplied from respective different signal routes.

In a case of a transition from the state ST2 to a state in which the object B to be detected moves away from the proximity sensor 1, so that the electric current signal S3 becomes less than the second threshold electric current, that is, in a case where the determination section 4 makes a third determination in which the electric current signal S3 decreases from the electric current which is in the range of not less than the second threshold electric current but less than the first threshold electric current to an electric current of less than the second threshold electric current, a transition occurs from the state ST2 to the state ST1. In this case, 2'b00 is stored in the register of the determination section 4.

Since the lower bit of the register changes from "1" to "0," the proximity sensor 1 is changed from the proximity state to the non-proximity state. The lower bit which has changed from "1" to "0" is supplied, as the interrupt signal S4,' to the control section 5. The control section 5 supplies, to the electronic device in which the proximity sensor 1 is mounted, the interrupt signal S4' as a signal 6 for (i) indicating that the proximity sensor 1 has been changed from the proximity state to the non-proximity state and (ii) controlling the operation of the electronic device.

As described above, the determination section 4 generates the interrupt signal S4' and supplies the interrupt signal S4' (have the interrupt signal S4' transmitted) to the control section 5, when a transition has occurred from the state ST1 to the state ST2 or from the state ST2 to the state ST1.

The control section 5 supplies the interrupt signal S4,' as the signal S6, to the electronic device. The signal S6 controls, for example, turning on and off of a screen (display), included in the electronic device, for displaying an image. This makes it possible to reduce power consumption. In a case of an electronic device in which a touch panel is mounted, the signal S6 controls the touch panel to be turned on or off. This makes it possible to prevent an erroneous operation of the touch panel.

Thus, the interrupt signal S4' is a signal for notifying an external electronic device of the fact that a transition has occurred in the state of the proximity sensor 1. Here, in a case where the electronic device constantly checks whether the proximity sensor 1 is in the proximity state or the non-proximity state, a great deal of load will be applied to a host CPU that is included in the electronic device.

In view of the above, the electronic device is made to check, only when a transition has occurred in the state of the proximity sensor 1 (i.e., only in a case where the interrupt signal S4' is generated), whether the proximity sensor 1 is in the proximity state or the non-proximity state. This allows the host CPU to not always check, by means of polling or the like, whether the proximity sensor 1 is in the proximity state or the non-proximity state. It is therefore possible to reduce load on the host CPU.

Note that a signal for controlling the touch panel or the like included in the electronic device is supplied from the host CPU, which has received the signal S6.

The following description will discuss, with reference to FIG. 2 again, a case of changing from the state ST2 to a state in which the object B to be detected further approaches the proximity sensor 1, so that the electric current signal S3 becomes not less than the first threshold electric current. The state, in which the electric current signal S3 is not less than the first threshold electric current, is defined as a state ST3.

In a case where the determination section 4 makes a fourth determination in which the electric current signal S3 is not less than the first threshold electric current, 2'b11 is stored in the 2-bit register of the determination section 4 (that is, 2'b11 is allocated to the state ST3).

Since the lower bit of the register remains "1," the proximity sensor 1 remains in the proximity state. The lower bit of "1" is supplied, as the determination result signal S4, to the control section 5. The control section 5 then supplies, to the electronic device in which the proximity sensor 1 is mounted, the determination result signal S4, as a signal S6 for (i) indicating that the proximity sensor 1 is in the proximity state and (ii) controlling the operation of the electronic device.

In a case of a transition from the state ST3 to a state in which the object B to be detected moves away from the proximity sensor 1, so that the electric current signal S3 becomes less than the first threshold electric current, that is, so that the electric current signal S3 decreases from an electric current of not less than the first threshold electric current to an electric current which is in the range of not less than the second threshold electric current but less than the first threshold electric current, such a state is defined as a state ST4.

In a case where the determination section 4 makes a fifth determination in which the electric current signal S3 has decreased from the electric current of not less than the first threshold electric current to the electric current in the range of not less than the second threshold electric current but less than the first threshold electric current, 2'b10 is stored in the register of the determination section 4 (that is, 2'b10 is allocated to the state ST4).

Since the lower one bit of the register changes from "1" to "0," the proximity sensor 1 is changed from the proximity state to the non-proximity state. The lower one bit which has changed from "1" to "0" is supplied, as the interrupt signal S4,' to the control section 5. The control section 5 supplies, to the electronic device in which the proximity sensor 1 is mounted, the interrupt signal S4' as the signal S6 for (i) indicating that the proximity sensor 1 has been changed from the proximity state to the non-proximity state and (ii) controlling the operation of the electronic device.

In a case of a transition from the state ST4 to a state in which the object B to be detected approaches the proximity sensor 1, so that the electric current signal S3 becomes not less than the first threshold electric current, that is, in a case where the determination section 4 makes a sixth determination in which the electric current signal S3 increases from the electric current which is in the range of not less than the second threshold electric current but less than the first threshold electric current to an electric current of not less than the first threshold electric current, a transition occurs from the state ST4 to the state ST3. In this case, 2'b11 is stored in the register of the determination section 4.

Since the lower bit of the register changes from "0" to "1," the proximity sensor 1 is changed from the non-proximity state to the proximity state. The lower bit which has changed from "0" to "1" is supplied, as the interrupt signal S4,' to the control section 5. The control section 5 supplies, to the electronic device in which the proximity sensor 1 is mounted, the interrupt signal S4' as the signal S6 for (i) indicating that the proximity sensor 1 has been changed from the non-proximity state to the proximity state and (ii) controlling the operation of the electronic device.

As described above, the determination section 4 generates the interrupt signal S4' and supplies the interrupt signal S4' (have the interrupt signal S4' transmitted) to the control section 5, when a transition has occurred from the state ST3 to the state ST4 or from the state ST4 to the state ST3.

The control section 5 supplies the interrupt signal S4,' as the signal S6, to the electronic device. The signal S6 controls, for example, the turning on and off of the screen (display) of the electronic device. In the case of the electronic device in which the touch panel is mounted, the signal S6 controls the touch panel to be turned on or off. This makes it possible to prevent an erroneous operation of the touch panel.

In a case of a transition from the state ST4 to a state in which the electric current signal S3 becomes less than the second threshold electric current, that is, in a case where the determination section 4 makes a seventh determination in which the electric current signal S3 decreases from the electric current which is in the range of not less than the second threshold electric current but less than the first threshold electric current changes to an electric current of less than the second threshold electric current, a transition occurs from the state ST4 to the state ST1. In this case, 2'b00 is stored in the 2-bit register of the determination section 4.

Since the lower bit of the register remains "0", the proximity sensor 1 remains in the non-proximity state. The lower bit of "0" is supplied, as the determination result signal S4, to the control section 5. The control section 5 supplies, to the electronic device in which the proximity sensor 1 is mounted, the determination result signal S4 as the signal S6 for (i) indicating that the proximity sensor 1 is in the non-proximity state and (ii) controlling the operation of the electronic device.

Figure 3:
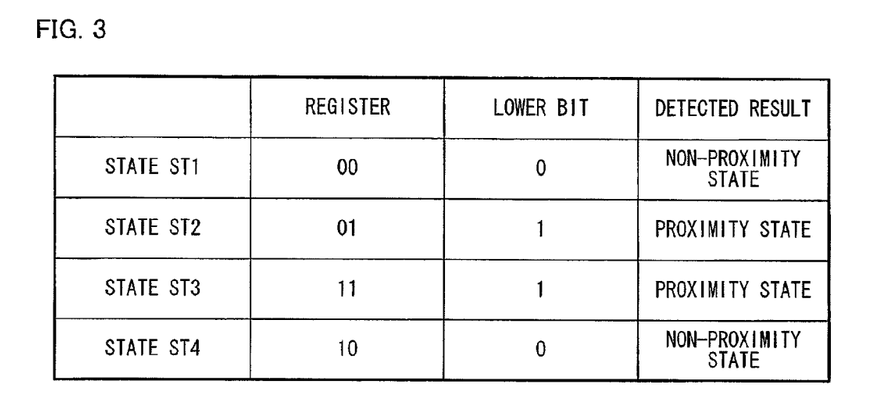
FIG. 3 is a diagram indicating (i) states of a determination section in accordance with an embodiment of the present invention, (ii) sets of two bits of a 2-bit register included in the determination section, (iii) lower bits of the 2-bit register, and (iv) results of detection whether or not an object to be detected comes close to the proximity sensor in accordance with an embodiment of the present invention.

FIG. 3 is a diagram indicating (i) states of the determination section 4 of the present embodiment, (ii) sets of two bits of the 2-bit register included in the determination section, (iii) lower bits of the 2-bit register, and (iv) results of detection whether or not the object B to be detected comes close to the proximity sensor 1.

As shown in FIG. 3, the proximity sensor 1 is in the proximity state when the lower bit of the register is "1," whereas the proximity sensor 1 is in the non-proximity state when the lower bit of the register is "0."

The following description will give a general overview of the proximity sensor 1 in accordance with the present embodiment. First, according to the determination section 104 of the conventional proximity sensor 101, (i) a transition of the object B to be detected occurs just once from the proximity state to the non-proximity state and (ii) even if the electric current signal S103 becomes less than the first threshold electric current, a transition of the object B to be detected does not occur unless the electric current signal S103 becomes not more than the second threshold electric current.

In contrast, according to the proximity sensor 1 of the present embodiment, first and second transitions of the object B to be detected occur from the proximity state to the non-proximity state (i.e., twice, one of which is at a time of updating to the state ST1 and the other of which is at a time of updating to the state ST4). As such, the first and second transitions occur immediately when the electric current signal S3 becomes less than the first threshold electric current or when the electric current signal S3 becomes less than the second threshold electric current, respectively. This allows an improvement in response of the proximity sensor 1 in accordance with the present embodiment, as compared with the conventional proximity sensor 101.

Likewise, according to the determination section 104 of the conventional proximity sensor 101, (i) a transition of the object B to be detected occurs just once from the non-proximity state to the proximity state and (ii) even if the electric current signal S103 becomes more than the second threshold electric current, a transition of the object B to be detected does not occur unless the electric current signal S103 becomes not less than the first threshold electric current.

In contrast, according to the proximity sensor 1 of the present embodiment, first and second transitions of the object B to be detected occur from the non-proximity state to the proximity state (i.e., twice, one of which is at a time of updating to the state ST2 and the other of which is at a time of updating to the state ST3). As such, the first and second transitions occur immediately when the electric current signal S3 becomes not less than the second threshold electric current or when the electric current signal S3 becomes not less than the first threshold electric current. This allows an improvement in response of the proximity sensor 1 in accordance with the present embodiment, as compared with the conventional proximity sensor 101.

Thus, a proximity sensor of the present embodiment has more transitions, as compared with a conventional proximity sensor, from the proximity state to the non-proximity state and vice versa. The proximity sensor of the present embodiment requires less time for such transitions than that required by the conventional proximity sensor. Therefore, the proximity sensor of the present embodiment is improved in response as compared with the conventional proximity sensor.

Note that, in the proximity sensor 1 in accordance with the present embodiment, the first threshold electric current and the second threshold electric current in the determination section 4 can be externally adjusted (changed). Specifically, the signal S1 (an externally supplied signal) is externally supplied to the control section 5. In a case where the signal S1 is a signal for instructing adjustment of the first threshold electric current and the second threshold electric current, the control section 5 supplies the threshold electric current adjusting signal S5 to the determination section 4.

Adjustment of the first threshold electric current and the second threshold electric current in this way makes it possible to appropriately adjust the distances D and E, based on which the proximity state or the non-proximity state is determined.

The description above discussed adjustment of both the first threshold electric current and the second threshold electric current. Needless to say, the present embodiment can employ a configuration in which (i) the signal S1 is a signal for instructing adjustment of the first threshold electric current or the second threshold electric current and (ii) only one of the first threshold electric current and the second threshold electric current is adjusted in response to the threshold electric current adjusting signal S5 being supplied to the determination section 4.

Figure 4:
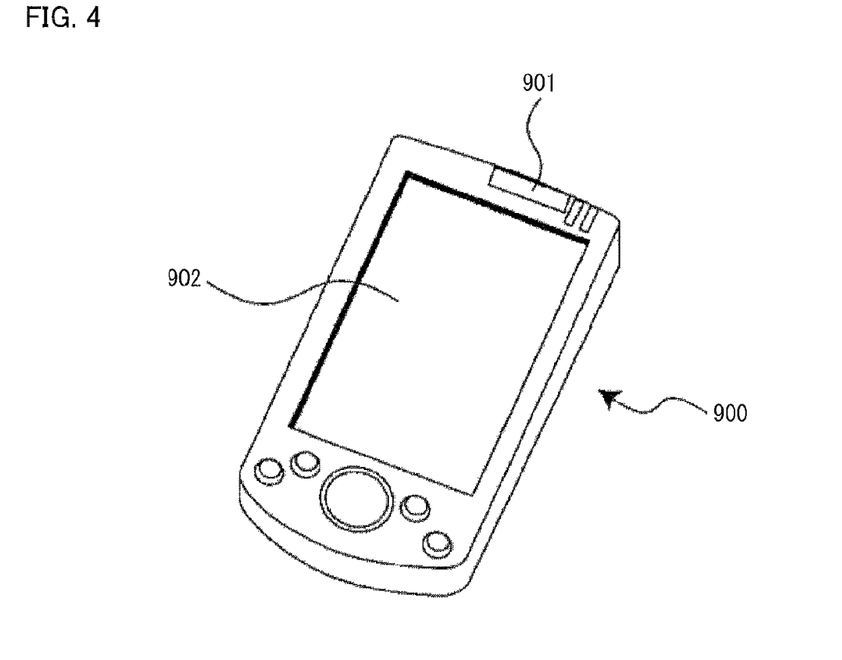
FIG. 4 is a perspective view of a mobile phone serving as an electronic device in accordance with an embodiment of the present invention.
Figure 5:
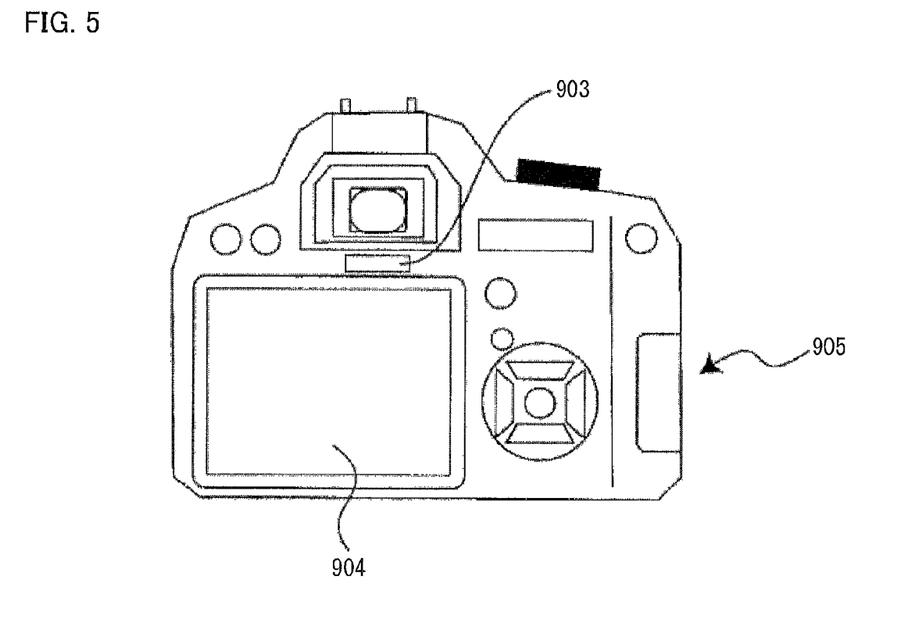
FIG. 5 is an elevation view of a digital camera serving as an electronic device in accordance with an embodiment of the present invention.

FIG. 4 and FIG. 5 illustrate respective examples of the electronic device in accordance with the present embodiment. FIG. 4 is a perspective view of a mobile phone 900 serving as the electronic device in accordance with the present embodiment. FIG. 5 is an elevation view of a digital camera 905 serving as the electronic device in accordance with the present embodiment.

As illustrated in FIG. 4, the mobile phone 900 employs, as a proximity sensor 901, any one of the early-described examples of the proximity sensor 1. The mobile phone 900, which includes a liquid crystal monitor 902, (i) turns on or off a display of a liquid crystal monitor 902 and (ii) turns on or off an LED backlight, which illuminates the liquid crystal monitor 902 from behind the liquid crystal monitor 902, in accordance with whether the object B to be detected is in the proximity state or the non-proximity state. The mobile phone 900 can turn on or off (i) the display of the liquid crystal monitor 902 and (ii) the LED backlight more quickly than it does in a case where the mobile phone 900 employs, as the proximity sensor 901, a conventional proximity sensor. This allows (i) an improvement in response of the mobile phone 900 and (ii) an improvement in user's operability of the mobile phone 900, as compared with a mobile phone employing a conventional proximity sensor.

As illustrated in FIG. 5, the digital camera 905 employs, as a proximity sensor 903, any one of the early-described examples of the proximity sensor 1. The digital camera 905, which includes a liquid crystal monitor 904, (i) turns on or off a display of the liquid crystal monitor 904 and (ii) turns on or off an LED backlight, which illuminates the liquid crystal monitor 904 from behind the liquid crystal monitor 904, in accordance with whether the object B to be detected is in the proximity state or the non-proximity state. The digital camera 905 can turn on or off (i) the display of the liquid crystal monitor 904 and (ii) the LED backlight more quickly than it does in a case where the digital camera 905 employs, as the proximity sensor 903, a conventional proximity sensor. This allows (i) an improvement in response of the digital camera 905 and (ii) an improvement in user's operability of the digital camera, as compared with a digital camera employing a conventional proximity sensor.

The electronic devices illustrated in FIG. 4 and FIG. 5 employ respective of the proximity sensor 901 and the proximity sensor 903, which are improved in response as compared with a conventional proximity sensor. This allows an improvement in user's operability of the electronic devices illustrated in FIG. 4 and FIG. 5.

Application Examples

An electronic device of the present invention employs any one of the examples of the proximity sensor 1, and is therefore improved in response as compared with an electronic device employing a conventional proximity sensor. Therefore, the electronic device of the present invention can be applied to a mobile device including a screen with a touch panel, the mobile device being typified by a mobile phone, a smart phone, and the like.

The proximity sensor 1 in accordance with the present embodiment can employ a configuration in which the storage section 21 is a 2-bit register which stores (i) "00" indicative of the state ST1, (ii) "01" indicative of the state ST2, (iii) "11" indicative of the state ST3, or (iv) "10" indicative of the state ST4, and the control section 5 (a) supplies, to the outside of the proximity sensor 1, the signal indicating that the object B to be detected comes close to the proximity sensor 1, in a case where a lower bit stored in the register is updated with "1" and (b) supplies, to the outside of the proximity sensor 1, the signal indicating that the object B to be detected does not come close to the proximity sensor 1, in a case where the lower bit is updated with "0."

According to the configuration, it is only necessary that the control section 5 use the lower bit of the two bits stored in the register. This allows a reduction in transmission quantity of the signals, and ultimately allows an improvement in response.

The proximity sensor 1 in accordance with the present embodiment can employ a configuration in which at least one of the first threshold electric current and the second threshold electric current is set in accordance with the signal S1 externally supplied.

By thus setting at least one of the first threshold electric current and the second threshold electric current in accordance with the signal S1 externally supplied, it becomes possible to appropriately adjust the distances D and E, each of which is a distance between the proximity sensor 1 and the object B to be detected and by use of which the determination is made whether the proximity sensor 1 is in the proximity state or the non-proximity state.

The electronic device of the present invention employs any one of the examples of the proximity sensor 1, and is therefore improved in response as compared with an electronic device employing a conventional proximity sensor.

The electronic device can further include a touch panel and the touch panel can be changed from an active state into a non-active state or vice versa in accordance with the signal S6 supplied from the control section 5. This makes it possible to prevent an erroneous operation of the touch panel.

Any one of the examples of the electronic device can further include a display screen for displaying an image and the display screen can be turned on or off in accordance with the signal supplied from the control section 5. This makes it possible to reduce power consumption.

Any one of the examples of the electronic device can be the mobile phone 900 or the digital camera 905. This allows the mobile phone 900 or the digital camera 905 to benefit from an improvement in response attained by the proximity sensor.

[Additional Matter]

Lastly, note that each block of the proximity sensor 1 can be (i) configured as hardware by use of logic circuits provided on an integrated circuit (IC chip) or (ii) realized by means of software by use of a CPU (central processing unit) as described below.

In a case of realizing the each block by means of software, the proximity sensor 1 (particularly, the determination section 4) includes a CPU for executing commands of a control program for implementing each function, a ROM (Read Only Memory) in which the program is stored, a RAM (Random Access Memory) on which the program is loaded, a storage device (recording medium), such as a memory, in which the program and various data are stored, and the like. An object of the present invention can be attained by the following procedures (i) and (ii): (i) loading, to the proximity sensor 1, the recording medium, in which program code (an executable program, an intermediate code program, and a source program) of the control program (software for implementing the functions) of the proximity sensor 1 is recorded so as to be read out by a computer and (ii) causing the computer (or a CPU or an MPU) to read out and execute the program code recorded in the recording medium.

For example, a tape such as a magnetic tape or a cassette tape, a disk including (i) a magnetic disk such as a Floppy® disk or a hard disk and (ii) an optical disk such as a CD-ROM, an MO, an MD, a DVD, or a CD-R, a card such as an IC card (including a memory card) or an optical card, a semiconductor memory such as a mask ROM, an EPROM, an EEPROM, or a flash ROM, a logic circuit such as a PLD (Programmable Logic Device) or the like can be used as the recording medium.

Further note that the proximity sensor 1 can be configured so as to be capable of being connected to a communications network via which the program code is loaded to the proximity sensor 1. The communications network is not limited to a specific one. The communications network can be, for example, an internet, an intranet, an extranet, a LAN, an ISDN, a VAN, a CATV communications network, a virtual private network, a telephone network, a mobile telecommunications network, a satellite communication network or the like. A transmission medium that constitutes the communications network is not limited to a specific one. The examples of the transmission medium encompass (i) wired communications such as IEEE1394, USB, a power-line carrier, a CATV line, a telephone line, or ADSL and (ii) wireless communications such as infrared communication by means of IrDA or remote control, Bluetooth®, IEEE802.11 wireless, HDR (High Data Rate), NFC (Near Field Communication), DLNA (Digital Living Network Alliance), a mobile phone network, a satellite circuit, or a terrestrial digital network.

'Means' in the Description does not necessarily denote physical means but includes a case where a function of each means is implemented by software. Note that a function of single means can be implemented by two or more physical means. Alternatively, functions of two or more means can be implemented by single physical means.

The proximity sensor can employ a configuration in which the storage means is a 2-bit register which stores (i) "00" indicative of the first information, (ii) "01" indicative of the second information, (iii) "11" indicative of the third information, or (iv) "10" indicative of the fourth information, and the controlling means (a) supplies, to the outside of the proximity sensor, the signal indicating that the object to be detected comes close to the proximity sensor, in a case where a lower bit stored in the register is updated with "1" and (b) supplies, to the outside of the proximity sensor, the signal indicating that the object to be detected does not come close to the proximity sensor, in a case where the lower bit is updated with "0."

According to the configuration, it is only necessary that the controlling means use only the lower bit of the two bits stored in the register. This allows a reduction in transmission quantity of the signal, and ultimately allows an improvement in response.

In any one of the examples of the proximity sensor, at least one of the first threshold and the second threshold can be set in accordance with a signal externally supplied.

By thus setting at least one of the first threshold and the second threshold in accordance with the signal externally supplied, it becomes possible to appropriately adjust the distances between the proximity sensor and the object to be detected and by use of which the determination is made whether the proximity sensor 1 is in the proximity state or the non-proximity state.

The electronic device can further include a touch panel and the touch panel can be changed from an active state into a non-active state or vice versa in accordance with the signal supplied from the controlling means. This makes it possible to prevent an erroneous operation of the touch panel.

Any one of the examples of the electronic device can further include a display screen for displaying an image and the display screen can be turned on or off in accordance with the signal supplied from the controlling means. This makes it possible to reduce power consumption.

Any one of the examples of the electronic device can be a mobile phone or a digital camera. This allows the mobile phone or the digital camera to benefit from an improvement in response attained by the proximity sensor.

The present invention is not limited to the above-described embodiments but allows various modifications within the scope of the claims. Any embodiment derived from an appropriate combination of the technical means disclosed in the different embodiments will also be included in the technical scope of the present invention.

INDUSTRIAL APPLICABILITY

The proximity sensor of the present invention can be applied to a proximity sensor mounted in an electronic device. The proximity sensor of the present invention can be suitably applied to a mobile device, such as a mobile phone or a smart phone, in which a screen having a touch panel is included.

REFERENCE SIGNS LIST

1: proximity sensor
2: light-emitting element
3: light-receiving element
4: determination section (determination means)
5: control section (controlling means)
6: projected light
7: reflected light
21: storage section (storage means)
22: state updating section (state updating means)
900: mobile phone
901, 903: proximity sensor
902: liquid crystal monitor
904: liquid crystal monitor
905: digital camera
B: object to be detected
I: electric current
S1: signal (signal externally supplied)
S2: light emission instruction signal
S3: electric current signal
S4: determination result signal
S4': interrupt signal
S5: threshold electric current adjusting signal
S6: signal
ST1: state (first information)
ST2: state (second information)
ST3: state (third information)
ST4: state (fourth information)
X: distance

The invention claimed is:
1. A proximity sensor for detecting whether or not an object to be detected comes close to the proximity sensor, comprising:
a light-emitting element for projecting light toward a predetermined space;
a light-receiving element for (i) receiving reflected light, which is light obtained when the light projected by the light-emitting element is reflected from the object to be detected and (ii) outputting an electric current signal in accordance with a quantity of the reflected light;
storage means for storing state information indicative of a state of the electric current signal;
determination means for determining (i) a larger one between the electric current signal and a first threshold and (ii) a larger one between the electric current signal and a second threshold, the second threshold being smaller than the first threshold;

state updating means for (i) updating the state information with first information indicating that the electric current signal is not more than the second threshold, when it is determined by the determination means that the electric current signal is not more than the second threshold, (ii) updating the state information with second information indicating that the electric current signal is more than the second threshold, when (a) it is determined by the determination means that the electric current signal is more than the second threshold and (b) the state information is the first information, (iii) updating the state information with third information indicating that the electric current signal is not less than the first threshold, when it is determined by the determination means that the electric current signal is not less than the first threshold, and (iv) updating the state information with fourth information indicating that the electric current signal is less than the first threshold, when (a) it is determined by the determination means that the electric current signal is less than the first threshold and (b) the state information is the third information; and controlling means for (i) supplying, to an outside of the proximity sensor, a signal indicating that the object to be detected does not come close to the proximity sensor, in a case where the state information is updated with the first information or the fourth information and (ii) supplying, to the outside of the proximity sensor, a signal for indicating that the object to be detected comes close to the proximity sensor, in a case where the state information is updated with the second information or the third information.

2. The proximity sensor of claim 1, wherein:
the storage means is a 2-bit register which stores (i) "00" indicative of the first information, (ii) "01" indicative of the second information, (iii) "11" indicative of the third information, or (iv) "10" indicative of the fourth information, and the controlling means (a) supplies, to the outside of the proximity sensor, the signal indicating that the object to be detected comes close to the proximity sensor, in a case where a lower bit stored in the register is updated with "1" and (b) supplies, to the outside of the proximity sensor, the signal indicating that the object to be detected does not come close to the proximity sensor, in a case where the lower bit is updated with "0."

3. The proximity sensor of claim 1 or 2, wherein at least one of the first threshold and the second threshold is set in accordance with a signal externally supplied.

4. An electronic device comprising a proximity sensor for detecting whether or not an object to be detected comes close to the proximity sensor,
said proximity sensor including:
a light-emitting element for projecting light toward a predetermined space;

a light-receiving element for (i) receiving reflected light, which is light obtained when the light projected by the light-emitting element is reflected from the object to be detected and (ii) outputting an electric current signal in accordance with a quantity of the reflected light;

storage means for storing state information indicative of a state of the electric current signal;

determination means for determining (i) a larger one between the electric current signal and a first threshold and (ii) a larger one between the electric current signal and a second threshold, the second threshold being smaller than the first threshold;

state updating means for (i) updating the state information with first information indicating that the electric current signal is not more than the second threshold, when it is determined by the determination means that the electric current signal is not more than the second threshold, (ii) updating the state information with second information indicating that the electric current signal is more than the second threshold, when (a) it is determined by the determination means that the electric current signal is more than the second threshold and (b) the state information is the first information, (iii) updating the state information with third information indicating that the electric current signal is not less than the first threshold, when it is determined by the determination means that the electric current signal is not less than the first threshold, and (iv) updating the state information with fourth information indicating that the electric current signal is less than the first threshold, when (a) it is determined by the determination means that the electric current signal is less than the first threshold and (b) the state information is the third information; and controlling means for (i) supplying, to an outside of the proximity sensor, a signal indicating that the object to be detected does not come close to the proximity sensor, in a case where the state information is updated with the first information or the fourth information and (ii) supplying, to the outside of the proximity sensor, a signal for indicating that the object to be detected comes close to the proximity sensor, in a case where the state information is updated with the second information or the third information.

5. An electronic device of claim 4, further comprising:
a touch panel,
the touch panel being changed from an active state into a non-active state or vice versa in accordance with the signal supplied from the controlling means.

6. An electronic device of claim 4, further comprising:
a display screen for displaying an image,
the display screen being turned on or off in accordance with the signal supplied from the controlling means.

7. The electronic device of any one of claims 4 through 6, wherein the electronic device is a mobile phone or a digital camera.

* * * * *